United States Patent
Kim et al.

(10) Patent No.: US 10,446,769 B2
(45) Date of Patent: Oct. 15, 2019

(54) DISPLAY DEVICE HAVING BENDING AREA

(71) Applicant: SAMSUNG DISPLAY CO., LTD., Yongin-si, Gyeonggi-do (KR)

(72) Inventors: Tae Woong Kim, Yongin-si (KR); Hyun Woo Koo, Hwaseong-si (KR); Ki Hyun Kim, Daegu (KR); Young Gug Seol, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/849,426

(22) Filed: Sep. 9, 2015

(65) Prior Publication Data
US 2016/0218305 A1 Jul. 28, 2016

(30) Foreign Application Priority Data
Jan. 28, 2015 (KR) .................. 10-2015-0013811

(51) Int. Cl.
| | | |
|---|---|---|
| *H01L 51/00* | (2006.01) | |
| *H01L 51/52* | (2006.01) | |
| *H01L 27/32* | (2006.01) | |
| *G02F 1/1333* | (2006.01) | |
| *G02F 1/1345* | (2006.01) | |

(52) U.S. Cl.
CPC ........ *H01L 51/0097* (2013.01); *G02F 1/1345* (2013.01); *G02F 1/133305* (2013.01); *G02F 1/133345* (2013.01); *H01L 27/3258* (2013.01); *H01L 27/3276* (2013.01); *G02F 2001/133388* (2013.01); *H01L 2251/5338* (2013.01); *H01L 2251/5392* (2013.01); *Y02E 10/549* (2013.01)

(58) Field of Classification Search
CPC .......... H01L 51/00; H01L 51/52; H01L 27/32
USPC .................. 257/40, 88; 349/12, 110, 160
See application file for complete search history.

(56) References Cited

U.S. PATENT DOCUMENTS

| | | | |
|---|---|---|---|
| 8,665,236 B2 | 3/2014 | Myers | |
| 2007/0023758 A1* | 2/2007 | Tsurume et al. | 257/66 |
| 2009/0161048 A1* | 6/2009 | Satake et al. | 349/110 |
| 2012/0146886 A1* | 6/2012 | Minami et al. | 345/80 |
| 2014/0097408 A1 | 4/2014 | Kim et al. | |
| 2014/0132487 A1* | 5/2014 | Park | G02F 1/13454 345/55 |
| 2014/0138637 A1* | 5/2014 | Yang | H01L 27/1218 257/40 |

(Continued)

FOREIGN PATENT DOCUMENTS

| | | |
|---|---|---|
| JP | 2007-288078 A | 11/2007 |
| KR | 10-1155907 B1 | 6/2012 |
| KR | 10-2013-0095579 A | 8/2013 |

OTHER PUBLICATIONS

EPO Search Report dated May 20, 2016, for corresponding European Patent application 16150810.6, (10 pages).

(Continued)

*Primary Examiner* — Sheng-Bai Zhu
(74) *Attorney, Agent, or Firm* — Lewis Roca Rothgerber Christie LLP (57) ABSTRACT

A display device includes: a flexible substrate including a bending area bent in one direction; an insulating layer on the flexible substrate and comprising a plurality of opening patterns spaced apart from each other at the bending area; and a wavy line extending through the plurality of opening patterns.

22 Claims, 7 Drawing Sheets

(56) References Cited

U.S. PATENT DOCUMENTS

| | | | |
|---|---|---|---|
| 2014/0217373 A1* | 8/2014 | Youn | H01L 23/4985 257/40 |
| 2014/0231763 A1* | 8/2014 | Kim | H01L 27/3218 257/40 |
| 2014/0232956 A1* | 8/2014 | Kwon et al. | 349/12 |
| 2014/0306941 A1* | 10/2014 | Kim | G06F 1/1652 345/204 |
| 2015/0041769 A1 | 2/2015 | Kim et al. | |

OTHER PUBLICATIONS

Abstract Publication No. 10-2010-0130898, dated Jun. 20, 2012, for KR 10-1155907 B1, 1 page.

* cited by examiner

DISPLAY DEVICE HAVING BENDING AREA

CROSS-REFERENCE TO RELATED APPLICATION

This application claims priority to and the benefit of Korean Patent Application No. 10-2015-0013811 filed in the Korean Intellectual Property Office on Jan. 28, 2015, the entire contents of which are incorporated herein by reference.

BACKGROUND

1. Field

Aspects of embodiments of the present invention relate to a display device.

2. Description of the Related Art

A display device is a device configured to display an image, and recently, organic light emitting diode displays have received attention.

Because organic light emitting diode displays have a self-emission characteristic and do not require a separate light source, unlike liquid crystal displays, organic light emitting diode displays may have relatively lower weight and less thickness. Further, organic light emitting diode displays have high-quality characteristics such as relatively low power consumption, high luminance, and a high response speed.

Generally, organic light emitting diode displays include a substrate, a plurality of thin film transistors positioned on the substrate, a plurality of insulating layers disposed between wires configuring the thin film transistors, and organic light emitting elements coupled to the thin film transistors.

Recently, flexible organic light emitting diode displays have been developed, in which a flexible substrate including a polymer material is included and at least a part of the flexible substrate is bent.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention relate to a display device, and a display device including a flexible substrate.

The present invention has been made in an effort to provide a display device having characteristics of suppressing a wire corresponding to a bending part and an insulating layer from being damaged by stress even though at least a part of the flexible substrate is bent.

According to example embodiments of the present invention, a display device includes: a flexible substrate comprising a bending area bent in one direction; an insulating layer on the flexible substrate and comprising a plurality of opening patterns spaced apart from each other at the bending area; and a wavy line extending through the plurality of opening patterns.

The wavy line may be curved and extends along a surface of the insulating layer and a bottom of each of the plurality of opening patterns.

The flexible substrate may further include a display area for displaying an image, and the display device may further include a display unit on the flexible substrate to correspond to the display area and configured to display the image.

The display area may be at a center of the flexible substrate, and the bending area may be outside the flexible substrate.

The display area may be adjacent the bending area, and the display device may further include a window on display unit at the display area.

The window may cover the display area and not the bending area.

The display unit may include: an organic light emitting element on the flexible substrate; and a thin film transistor connected with the organic light emitting element.

The organic light emitting element may include: a first electrode connected with the thin film transistor; an organic emission layer on the first electrode; and a second electrode on the organic emission layer.

The thin film transistor may include: an active layer on the flexible substrate; a gate electrode on the active layer; and a source electrode and a drain electrode connected with the active layer.

The wavy line may be on a same layer as at least one of the gate electrode and the source electrode.

The insulating layer may further include a first sub insulating layer covering the gate electrode.

The opening patterns may be on the first sub insulating layer.

The insulating layer may further include a second sub insulating layer covering the active layer.

The opening patterns may be on at least one of the first sub insulating layer and the second sub insulating layer.

The insulating layer may further include a third sub insulating layer between the flexible substrate and the active layer.

The opening patterns may be on at least one of the first sub insulating layer, the second sub insulating layer, and the third sub insulating layer.

Compressive stress may be applied to the wavy line at the bending area.

The display device may further include a first protective film above the wavy line at the bending area; and a second protective film below the wavy line at the bending area.

The flexible substrate may have a curvature radius in a downward direction at the bending area.

The first protective film may be thicker than the second protective film.

A Young's modulus of the second protective film may be larger than a Young's modulus of the first protective film.

The flexible substrate may have a curvature radius in an upward direction at the bending area.

The second protective film may be thicker than the first protective film.

A Young's modulus of the first protective film may be larger than that of the second protective film.

The flexible substrate may have a curvature radius at the bending area, and a distance between adjacent opening patterns among the plurality of opening patterns may be proportional to a size of the curvature radius.

The insulating layer may include an inorganic material.

The insulating layer may include an organic material.

According to example embodiments of the present invention, it may be possible to suppress a wire corresponding to a bending part and an insulating layer from being damaged by stress even though at least a part of the flexible substrate is bent.

DETAILED DESCRIPTION

Aspects of example embodiments of the present invention will be described more fully hereinafter with reference to the accompanying drawings, in which example embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Further, in example embodiments, because like reference numerals designate like elements having the same configuration, a first example embodiment is representatively described, and in other example embodiments, only a configuration different from the first example embodiment will be described.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising," will be understood to imply the inclusion of stated elements but not the exclusion of any other elements. Further, throughout the specification, the word "on" means positioning on or below the object portion, but does not essentially mean positioning on the upper side of the object portion based on a gravity direction.

Hereinafter, a display device according to an example embodiment of the present invention will be described with reference to FIG. 1.

Hereinafter, an organic light emitting diode display including an organic light emitting element is described as an example of the display device, but a display device according to another example embodiment of the present invention may be various display devices such as liquid crystal displays (LCDs), plasma displays (PDs), field emission displays (FEDs), electrophoretic displays (EPDs), and electrowetting displays (EWDs) if the display device includes a display unit displaying an image.

Figure 1:
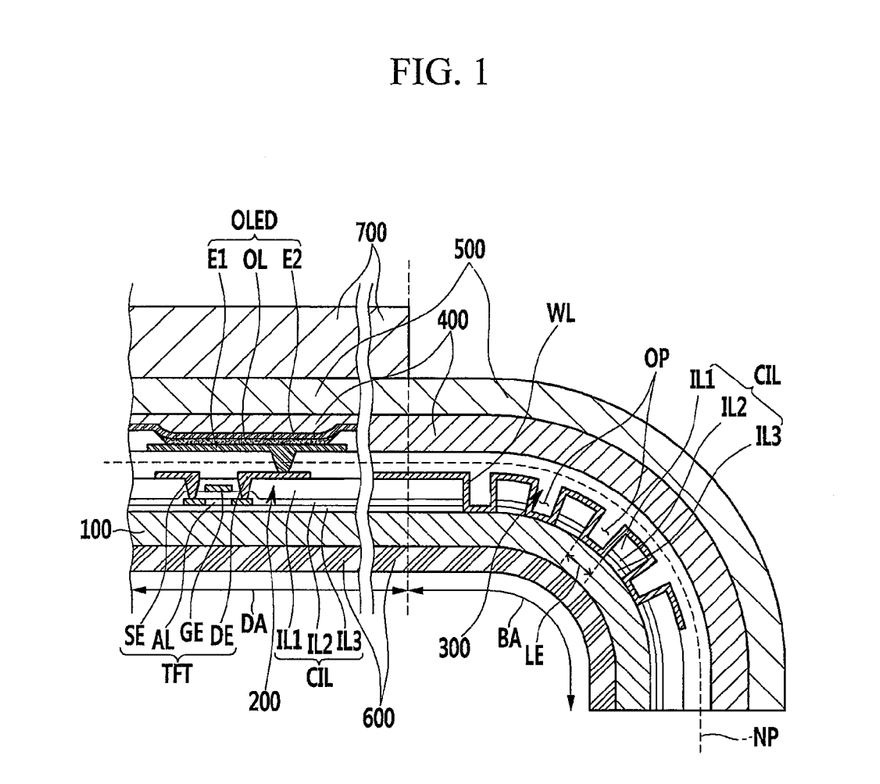
FIG. 1 is a cross-sectional view illustrating a part of a display device, according to an example embodiment of the present invention.

FIG. 1 is a cross-sectional view illustrating a part of a display device according to an example embodiment of the present invention. FIG. 1 is a cross-sectional view illustrating a central part and an outer part of a display device according to an example embodiment of the present invention.

As illustrated in FIG. 1, the display device according to the example embodiment of the present invention includes a flexible substrate 100, a display unit 200, a bending unit 300, a sealing unit 400, a first protective film 500, a second protective film 600, and a window 700.

The flexible substrate 100 is flexible, but is not limited thereto and may be stretchable, foldable, bendable, or rollable. The flexible substrate 100 is flexible, stretchable, foldable, bendable, or rollable, and as a result, the entire display device may be flexible, stretchable, foldable, bendable, or rollable.

The flexible substrate 100 may be bent in one direction. Here, one direction may be any direction on a surface of the flexible substrate 100 and is not limited to a predetermined direction. For example, the flexible substrate 100 may have a rectangular shape in a plane, and in this case, one direction in which the rectangular flexible substrate 100 is bent may be a parallel direction to a long side or a short side of the flexible substrate 100. That is, the flexible substrate 100 may be bent in the short side direction or the long side direction in the plane.

The flexible substrate 100 may include one or more of a polymer material such as polyimide, a metal material, and an inorganic material, and is not limited thereto and may include any material if the flexible substrate 100 may be bent. The flexible substrate 100 may have a film form.

The flexible substrate 100 includes a display area DA displaying an image and a bending area BA bent in one direction. The display area DA may be positioned at the center of the flexible substrate 100, and the bending area BA may be positioned outside (e.g., at a periphery or peripheral area of) or outside a footprint of the flexible substrate 100. The bending area BA of the flexible substrate 100 is adjacent to the display area DA. One portion of the flexible substrate 100 corresponding to the bending area BA has a curvature radius in a downward direction, but is not limited thereto and one portion of the flexible substrate 100 corresponding to the bending area BA may have a curvature radius in an upward direction.

Meanwhile, in the example embodiment of the present invention, the bending area BA is positioned outside (e.g., outside a footprint of) the flexible substrate 100, but is not limited thereto, and in another example embodiment of the present invention, the bending area BA may be positioned at the center of the flexible substrate 100 or positioned to overlap with the display area DA.

The display unit 200 is positioned on the flexible substrate 100 to correspond to the display area DA of the flexible substrate 100 and may display an image by using a plurality of pixels. Here, the pixel may mean a minimum unit for displaying the image.

The display unit 200 includes an organic light emitting diode OLED emitting light, an insulating layer CIL, and a thin film transistor TFT coupled with the organic light emitting diode OLED. Meanwhile, in the example embodiment of the present invention, for convenience of description, the display unit 200 includes the organic light emitting diode OLED and the thin film transistor TFT, but the present invention is not limited thereto, and the display unit 200 may further include one or more scan wires, one or more data wires, a plurality of thin film transistors, and one or more capacitors, and these configurations may have various known structures.

The thin film transistor TFT includes an active layer AL, a gate electrode GE, a source electrode SE, and a drain electrode DE.

The active layer AL is positioned on the flexible substrate 100 and may be made of polysilicon or an oxide semiconductor. The oxide semiconductor may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof.

The active layer AL includes a channel region in which impurities are not doped, and a source region and a drain region formed when impurities are doped to two sides of the channel region. Herein, the impurities vary according to a kind of thin film transistor, and may be N-type impurities or P-type impurities. In the case where the active layer AL is formed of the oxide semiconductor, in order to protect the oxide semiconductor, which is vulnerable to the external environment such as exposure to a high temperature, a separate passivation layer may be added.

The gate electrode GE is positioned on the active layer AL, and the source electrode SE and the drain electrode DE are positioned on the upper side of the gate electrode GE and connected with the source region and the drain region of the active layer AL through a contact hole, respectively.

In order to prevent or reduce instances of a short-circuit between the active layer AL, the gate electrode GE, the source electrode SE, and the drain electrode DE, which are configurations of the thin film transistor TFT, the insulating layer CIL is positioned between the configurations of the thin film transistor TFT.

The insulating layer CIL includes a first sub insulating layer IL1, a second sub insulating layer IL2, and a third sub insulating layer IL3.

The first sub insulating layer IL1 covers the gate electrode GE and may serve to prevent or reduce instances of a short circuit between the gate electrode GE and the source electrode SE. The first sub insulating layer IL1 may be formed by at least one layer.

The second sub insulating layer IL2 covers the active layer AL and is positioned between the active layer AL and the gate electrode GE. The second sub insulating layer IL2 may serve to prevent or reduce instances of a short circuit between the active layer AL and the gate electrode GE. The second sub insulating layer IL2 may be formed by one or more layers.

The third sub insulating layer IL3 is positioned between the flexible substrate 100 and the active layer AL and may serve to planarize the surface of the flexible substrate 100 and simultaneously, prevent or reduce instances of moisture from permeating from the flexible substrate 100.

As such, the insulating layer CIL includes an inorganic material such as silicon nitride or silicon oxide, and for example, the insulating layer CIL may include one or more of SiNx, $Al_2O_3$, $SiO_2$, and $TiO_2$.

The organic light emitting diode OLED includes a first electrode E1 connected with the drain electrode DE of the thin film transistor TFT, an organic emission layer EL positioned on the first electrode E1, and a second electrode E2 positioned on the organic emission layer EL.

The first electrode E1 may be an anode which is a hole injection electrode, and may be one electrode of light-reflective, light-transflective, and light-transmissive electrodes. According to some example embodiments of the present invention, the first electrode E1 may be a cathode which is an electron injection electrode.

The organic emission layer EL is positioned on the first electrode E1. The organic emission layer EL may be made of a low-molecular organic material or a high-molecular organic material such as poly 3,4-ethylenedioxythiophene (PEDOT). The organic emission layer EL may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image. In the organic emission layer EL, all of the red organic emission layer, the green organic emission layer, and the blue organic emission layer are together laminated on the red pixel, the green pixel, and the blue pixel, and a red color filter, a green color filter, and a blue color filter are formed for each pixel, thereby implementing the color image.

As another example, as the organic emission layer EL, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer as the organic emission layer EL and the color filters, a deposition mask may not be used for depositing the red organic emission layer, the green organic emission layer, and the blue organic emission layer on respective pixels, that is, the red pixel, the green pixel, and the blue pixel.

The white organic emission layer as the organic emission layer EL described in another example may be formed by one organic emission layer, and also includes a configuration formed so as to emit white light by laminating a plurality of organic emission layers. For example, the organic emission layer EL may include a configuration that may emit white light by combining at least one yellow organic emission layer and at least one blue light emitting layer, a configuration which may emit white light by combining at least one cyan organic emission layer and at least one red light emitting layer, a configuration that may emit white light by combining at least one magenta organic emission layer and at least one green light emitting layer, and the like.

The second electrode E2 is positioned on the organic emission layer EL and may be a cathode which is an electron injection electrode. The second electrode E2 may be one electrode of light-reflective, light-transflective, and light-transmissive electrodes. The second electrode E2 is positioned all over the display area DA of the flexible substrate 100 so as to cover the organic emission layer EL. According to some example embodiments of the present invention, the second electrode E2 may be an anode that is a hole injection electrode.

The bending unit 300 is formed integrally with the display unit 200 and positioned on the flexible substrate 100 to correspond to the bending area BA of the flexible substrate 100. The bending unit 300 is positioned on the flexible substrate 100 to correspond to the bending area BA which is bent in one direction to be bent in one direction. The bending unit 300 includes an insulating layer CIL extended from the display unit 200 and a wavy line WL extending from the display unit 200.

The insulating layer CIL of the bending unit 300 includes a plurality of opening patterns OP. The plurality of opening patterns OP is spaced apart from each other in one direction.

The opening patterns OP are formed on the insulating layer CIL, particularly, the first sub insulating layer IL1, the second sub insulating layer IL2, and the third sub insulating layer IL3.

According to some example embodiments of the present invention, the opening patterns OP are formed on the first sub insulating layer IL1, the second sub insulating layer IL2, and the third sub insulating layer IL3, but are not limited thereto. In another example embodiment of the present invention, the opening patterns OP may be formed on one or more layers of the first sub insulating layer IL1, the second sub insulating layer IL2, and the third sub insulating layer IL3.

A distance LE between the adjacent opening patterns OP among the plurality of opening patterns OP may be proportional to a size of a curvature radius of one portion of the flexible substrate 100 corresponding to the bending area BA. For example, when the size of the curvature radius of one portion of the flexible substrate 100 corresponding to the bending area BA is increased, the distance LE between the adjacent opening patterns OP is increased. When the size of the curvature radius of one portion of the flexible substrate 100 corresponding to the bending area BA is decreased, the distance LE between the adjacent opening patterns OP may be decreased.

The wavy line WL extends from the display unit 200 and may be electrically connected with one or more of the active layer AL, the gate electrode GE, the source electrode SE, and the drain electrode DE of the thin film transistor TFT of the display unit 200. The wavy line WL is a line extending from the display unit 200 and may serve to transfer a signal to the display unit 200.

The wavy line WL is positioned on the same layer as the source electrode SE and the drain electrode DE and includes the same material as the source electrode SE and the drain electrode DE, and may be concurrently (e.g., simultaneously) formed with the source electrode SE and the drain electrode DE.

According to some example embodiments of the present invention, the wavy line WL is positioned on the same layer as the source electrode SE and the drain electrode DE, but is not limited thereto. In another example embodiment of the present invention, the wavy line WL may be positioned on the same layer as one or more of the active layer AL, the gate electrode GE, the source electrode SE, and the drain electrode DE.

The wavy line WL is positioned on the insulating layer CIL to correspond to the bending area BA of the flexible substrate 100, and extends in one direction which is a bending direction of the flexible substrate 100 to pass through the plurality of opening patterns OP. The wavy line WL is curved and extending along the surface of the insulating layer CIL and the bottom of each of the plurality of opening patterns OP. In detail, the wavy line WL has a vertically zigzag shape along island-shaped insulating layer CIL patterns which are formed by the plurality of opening patterns OP and spaced apart from each other. In the example embodiment of the present invention, the wavy line WL has the vertically zigzag shape, but is not limited thereto. In another example embodiment of the present invention, the wavy line WL may have a horizontally zigzag shape. In this case, the wavy line WL may extend in a form that is bent one or more times in one direction on the surface of the flexible substrate 100.

As such, in the display device according to the example embodiment of the present invention, the insulating layer CIL includes the plurality of opening patterns OP which is spaced apart from each other in one direction to correspond to the bending area BA of the flexible substrate 100, and as a result, the insulating layer CIL positioned to correspond to the bending area BA has an island shape on the flexible substrate 100. The insulating layer CIL positioned on the flexible substrate 100 bent in one direction has the island shape to minimize stress applied to the insulating layer CIL when the flexible substrate 100 is bent in one direction.

That is, even though the insulating layer CIL has inherent brittleness of an inorganic material, the insulating layer CIL includes the plurality of opening patterns OP which is spaced apart from each other in one direction which is the bending direction of the flexible substrate 100, thereby minimizing damage of the insulating layer CIL itself by stress generated when the flexible substrate 100 is bent in one direction or damage of the wavy line WL which is a constituent element positioned on the insulating layer CIL by stress generated in the insulating layer CIL.

Further, in the display device according to the example embodiment of the present invention, the wavy line WL has the vertically zigzag shape to correspond to the bending area BA, and as a result, even though stress generated when the flexible substrate 100 is bent in one direction is applied to the wavy line WL, stress is distributed along a long path of the wavy line WL itself in the bending area BA to suppress the wavy line WL from being damaged by stress.

Further, the distance LE between the adjacent opening patterns OP among the plurality of opening patterns OP is proportional to the size of the curvature radius of one portion of the flexible substrate 100 corresponding to the bending area BA, and as a result, as the curvature radius of one portion of the flexible substrate 100 corresponding to the bending area BA is smaller, a path of the wavy line WL itself in the limited bending area BA may be much longer by shortening the distance LE between the adjacent opening pattern OP. As a result, even though large stress is applied to the wavy line WL because the curvature radius of one portion of the flexible substrate 100 is small, stress is distributed along the long path of the wavy line WL itself in the bending area BA to suppress the wavy line WL from being damaged by stress. This may act as a factor capable of further enlarging the curvature of the entire display device.

The sealing unit 400 is positioned on the flexible substrate 100 with the display unit 200 and the bending unit 300 therebetween. The sealing unit 400 is positioned on the flexible substrate 100 all over the display area DA and the bending area BA of the flexible substrate 100 and seals the display unit 200 and the bending unit 300 together with the flexible substrate 100. The sealing unit 400 may be formed by a thin film encapsulation unit. The sealing unit 400 may include an organic layer and an inorganic layer positioned on the organic layer. For example, the sealing unit 400 may include one or more organic layers and one or more inorganic layers which are alternately laminated, and particularly, the organic layers or the inorganic layers may be in plural, respectively, and the plurality of inorganic layers and the plurality of organic layers may be alternately laminated, respectively.

The sealing unit 400 may include at least one sandwich structure in which at least one organic layer is inserted between at least two inorganic layers. The inorganic layer positioned on the top layer of the sealing unit 400 may be laminated with a larger area than the organic layer so as to cover an end of the organic layer which is another layer. The organic layer of the sealing unit 400 is made of polymer, and preferably, may be a single layer or a laminated layer formed of any one of polyethylene terephthalate, polyimide, polycarbonate, epoxy, polyethylene, and polyacrylate. For example, the organic layer may be formed of polyacrylate, and in detail, includes a material in which a monomer composition including diacrylate-based monomers and triacrylate-based monomers is polymerized. Herein, the monomer composition may further include monoacrylate-based monomers, and further include a known photo-initiator such as TPO, but is not limited thereto. The inorganic layer of the sealing unit 400 may be a single layer or a laminated layer including metal oxide or metal nitride. In detail, the inorganic layer may include one or more of SiNx, $Al_2O_3$, $SiO_2$, and $TiO_2$.

A first protective film 500 is positioned on the sealing unit 400, and a second protective film 600 is positioned below the flexible substrate 100.

The first protective film 500 is attached onto the sealing unit 400 to correspond to the display area DA and the bending area BA of the flexible substrate 100 and serves to protect the sealing unit 400 from external interference.

The second protective film 600 is attached below the flexible substrate 100 to correspond to the display area DA and the bending area BA of the flexible substrate 100 and serves to protect the sealing unit 400 from external interference.

Further, each of the first protective film 500 and the second protective film 600 may have various thicknesses according to Young's modulus of each of the first protective film 500 and the second protective film 600.

For example, the first protective film 500 may have a larger thickness than the second protective film 600 so that compressive stress is applied to the insulating layer CIL and the wavy line WL corresponding to the bending area BA of the flexible substrate 100.

That is, the first protective film 500 positioned above the wavy line WL corresponding to the bending area BA may have a larger thickness than the second protective film 600 positioned below the wavy line WL corresponding to the bending area BA, and as a result, because a neutral plane NP of the display device formed by generating a bending moment in the bending area BA is formed above the wavy line WL, not tensile stress but compressive stress is applied to the insulating layer CIL and the wavy line WL.

As such, in the display device according to some example embodiments of the present invention, the first protective film 500 corresponding to the bending area BA has a larger thickness than the second protective film 600, and as a result, because the neutral plane NP of the display device formed in the bending area BA bent in one direction is formed above the wavy line WL by moving toward the first protective film 500, not tensile stress but compressive stress is applied to the insulating layer CIL and the wavy line WL to suppress the insulating layer CIL and the wavy line WL from being damaged by tensile stress.

The window 700 is positioned on the display unit 200 to correspond to the display area DA of the flexible substrate 100. The window 700 may be attached onto the surface of the sealing unit 400. The window 700 may protect the display unit 200 from the external interference, and a touch sensor recognizing a touch may be formed on at least one of the front surface and the rear surface of the window 700. Further, a phase retardation film and a polarizer that suppresses reflection by external light may be positioned on at least one of the front surface and the rear surface of the window 700. The window 700 covers only the display area DA in the display area DA and the bending area BA of the flexible substrate 100, and as a result, the bending unit 300 corresponding to the bending area BA of the flexible substrate 100 is exposed outside.

As such, the window 700 covers only the display area DA in the display area DA and the bending area BA of the flexible substrate 100, and as a result, the bending area BA of the flexible substrate 100 may be relatively easily bent in one direction.

Furthermore, the window 700 is attached onto the sealing unit 400 by covering only the display area DA of the flexible substrate 100, and as a result, the neutral plane NP formed on the bending unit 300 corresponding to bending area BA of the flexible substrate 100 prevents tensile stress from being applied to the wavy line WL by moving toward the wavy line WL by the window 700. That is, the window 700 covers only the display area DA of the flexible substrate 100 in order to relatively easily bend the bending unit 300 corresponding to the bending area BA of the flexible substrate 100.

As such, in the display device according to some example embodiments of the present invention, the insulating layer CIL includes the plurality of opening patterns OP that are spaced apart from each other in one direction to correspond to the bending area BA of the flexible substrate 100, and as a result, the insulating layer CIL positioned to correspond to the bending area BA has an island shape on the flexible substrate 100. The insulating layer CIL positioned on the flexible substrate 100 bent in one direction has the island shape to minimize stress applied to the insulating layer CIL when the flexible substrate 100 is bent in one direction.

That is, even though the insulating layer CIL has inherent brittleness of an inorganic material, the insulating layer CIL includes the plurality of opening patterns OP that are spaced apart from each other in one direction, which is the bending direction of the flexible substrate 100, thereby minimizing or reducing damage of the insulating layer CIL itself by stress generated when the flexible substrate 100 is bent in one direction or damage of the wavy line WL, which is a constituent element positioned on the insulating layer CIL by stress generated in the insulating layer CIL.

Further, in the display device according to some example embodiments of the present invention, the wavy line WL has the vertically zigzag shape to correspond to the bending area BA, and as a result, even though stress generated when the flexible substrate 100 is bent in one direction is applied to the wavy line WL, stress is distributed along a long path of the wavy line WL itself in the bending area BA to suppress the wavy line WL from being damaged by stress.

Further, in the display device according to some example embodiments of the present invention, the distance LE between the adjacent opening patterns OP among the plurality of opening patterns OP is proportional to the size of the curvature radius of one portion of the flexible substrate 100 corresponding to the bending area BA, and as a result, as the curvature radius of one portion of the flexible substrate 100 corresponding to the bending area BA is smaller, a path of the wavy line WL itself in the limited bending area BA may be much longer by shortening the distance LE between the adjacent opening patterns OP. As a result, even though a large amount of stress may be applied to the wavy line WL, because the curvature radius of one portion of the flexible substrate 100 is small, the stress is distributed along the long path of the wavy line WL itself in the bending area BA to suppress (e.g., minimize or reduce instances of) the wavy line WL from being damaged by stress. This may act as a factor capable of further enlarging the curvature of the entire display device.

Further, in the display device according to some example embodiments of the present invention, the first protective film 500 corresponding to the bending area BA has a larger thickness than the second protective film 600, and as a result, because the neutral plane NP of the display device formed in the bending area BA bent in one direction is formed above the wavy line WL by moving toward the first protective film 500, not tensile stress but compressive stress is applied to the insulating layer CIL and the wavy line WL to suppress (e.g., minimize or reduce instances of) the insulating layer CIL and the wavy line WL from being damaged by tensile stress.

Further, in the display device according to some example embodiments of the present invention, the window 700 covers only the display area DA in the display area DA and the bending area BA of the flexible substrate 100, and as a result, the bending area BA of the flexible substrate 100 is easily bent in one direction. Furthermore, the window 700 is attached onto the sealing unit 400 by covering only the display area DA of the flexible substrate 100, and as a result, the neutral plane NP formed in the bending area BA of the flexible substrate 100 prevents or reduces tensile stress from being applied to the wavy line WL by moving toward the wavy line WL by the window 700.

Hereinafter, a display device according to some example embodiments of the present invention will be described with reference to FIG. 2. Hereinafter, different parts from the display device according to the example embodiment of the present invention described above will be described, but some repetitive description may be omitted.

Figure 2:
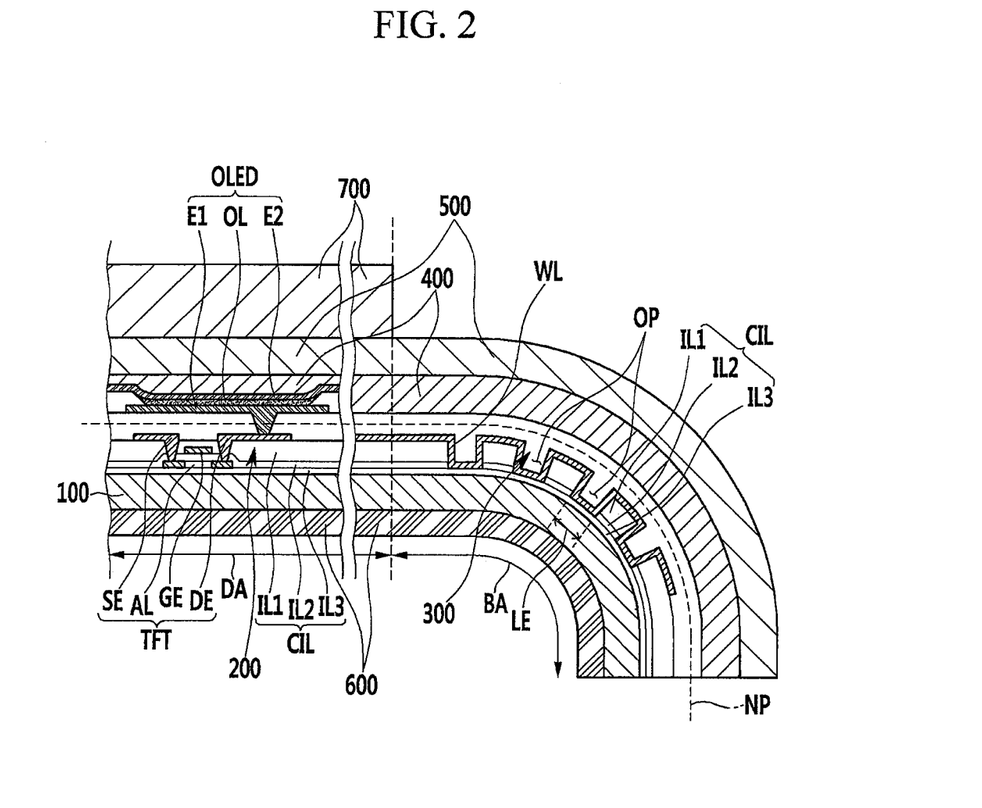
FIG. 2 is a cross-sectional view illustrating a part of a display device, according to an example embodiment of the present invention.

FIG. 2 is a cross-sectional view illustrating a part of a display device according to some example embodiments of the present invention.

As illustrated in FIG. 2, a bending unit 300 of the display device according to some example embodiments of the present invention includes an insulating layer CIL extending from a display unit 200 and a wavy line WL extending from the display unit 200.

At least one of a first sub insulating layer IL1, a second sub insulating layer IL2, and a third sub insulating layer IL3 of the insulating layer CIL may include one or more of polyimide, phenylene, siloxane, and the like. That is, the insulating layer CIL includes an organic material including one or more of polyimide, phenylene, siloxane, and the like.

The insulating layer CIL of the bending unit 300 includes a plurality of opening patterns OP. The plurality of opening patterns OP is spaced apart from each other in one direction.

The opening patterns OP are formed on the insulating layer CIL, particularly, the first sub insulating layer IL1 and the second sub insulating layer IL2.

A wavy line WL is positioned on the same layer as a source electrode SE and a drain electrode DE and includes the same material as the source electrode SE and the drain electrode DE, and may be concurrently (e.g., simultaneously) formed with the source electrode SE and the drain electrode DE.

The wavy line WL is positioned on the insulating layer CIL to correspond to a bending area BA of a flexible substrate 100, and extends in one direction which is a bending direction of the flexible substrate 100 to pass through the plurality of opening patterns OP. The wavy line WL is curved and extends along the surface of the insulating layer CIL and the bottom of each of the plurality of opening patterns OP. In detail, the wavy line WL has a vertically zigzag shape along island-shaped insulating layer CIL patterns which are formed by the plurality of opening patterns OP and spaced apart from each other.

As such, in the display device according to some example embodiments of the present invention, the insulating layer CIL includes the plurality of opening patterns OP that are spaced apart from each other in one direction to correspond to the bending area BA of the flexible substrate 100, and as a result, the insulating layer CIL positioned to correspond to the bending area BA has an island shape on the flexible substrate 100. The insulating layer CIL positioned on the flexible substrate 100 bent in one direction has the island shape to minimize stress applied to the insulating layer CIL when the flexible substrate 100 is bent in one direction.

Further, in the display device according to some example embodiments of the present invention, the wavy line WL has a vertically zigzag shape to correspond to the bending area BA, and as a result, even though stress generated when the flexible substrate 100 is bent in one direction is applied to the wavy line WL, stress is distributed along a long path of the wavy line WL itself in the bending area BA to suppress the wavy line WL from being damaged by stress.

Further, in the display device according to some example embodiments of the present invention, the insulating layer CIL includes an organic material having a large Young's modulus as compared with an inorganic material, and as a result, when the flexible substrate 100 is bent in one direction, the insulating layer CIL is easily transformed by stress to minimize damage of the insulating layer CIL itself or damage of the wavy line WL by stress generated in the insulating layer CIL.

Further, in the display device according to some example embodiments of the present invention, the insulating layer CIL includes an organic material having a large Young's modulus, and as a result, because the neutral plane NP of the display device formed in the bending area BA bent in one direction is formed above the wavy line WL by moving toward the first protective film 500, not tensile stress but compressive stress is applied to the insulating layer CIL and the wavy line WL to suppress the insulating layer CIL and the wavy line WL from being damaged by tensile stress.

Hereinafter, a display device according to some example embodiments of the present invention will be described with reference to FIG. 3. Hereinafter, different parts from the display device according to some example embodiments of the present invention described above will be described, but some repetitive description may be omitted.

Figure 3:
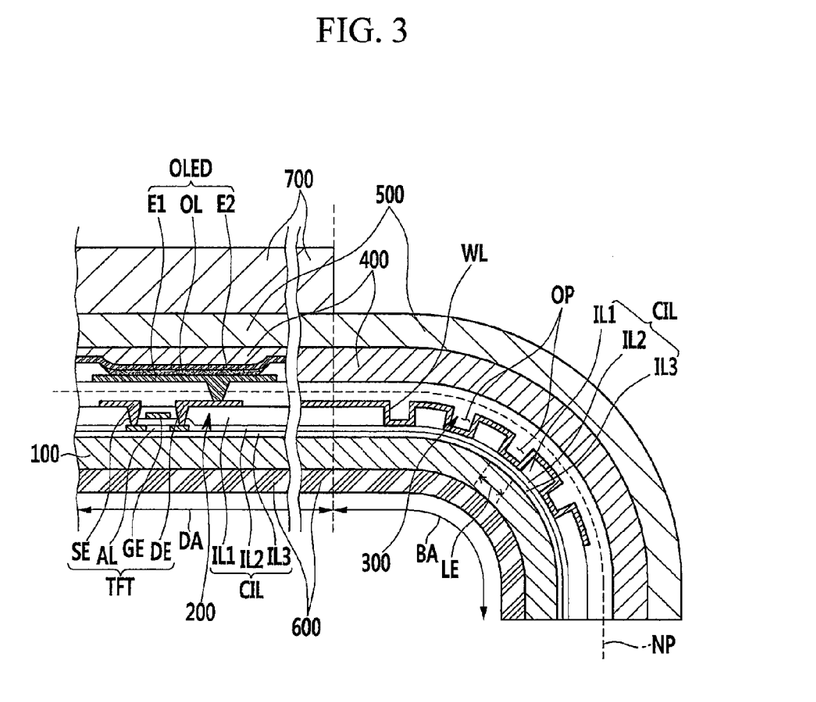
FIG. 3 is a cross-sectional view illustrating a part of a display device, according to an example embodiment of the present invention.

FIG. 3 is a cross-sectional view illustrating a part of a display device according to some example embodiments of the present invention.

As illustrated in FIG. 3, a bending unit 300 of the display device according to some example embodiments of the present invention includes an insulating layer CIL extending from a display unit 200 and a wavy line WL extending from the display unit 200.

The insulating layer CIL of the bending unit 300 includes a plurality of opening patterns OP. The plurality of opening patterns OP is spaced apart from each other in one direction.

The opening patterns OP are formed on the insulating layer CIL, particularly, the first sub insulating layer IL1.

A wavy line WL is positioned on the same layer as a source electrode SE and a drain electrode DE and includes the same material as the source electrode SE and the drain electrode DE, and may be simultaneously formed with the source electrode SE and the drain electrode DE.

The wavy line WL is positioned on the insulating layer CIL to correspond to a bending area BA of a flexible substrate 100, and extending in one direction which is a bending direction of the flexible substrate 100 to pass through the plurality of opening patterns OP. The wavy line WL is curved and extends along the surface (e.g., follows a contour) of the insulating layer CIL and the bottom of each of the plurality of opening patterns OP. In detail, the wavy line WL has a vertically zigzag shape along island-shaped insulating layer CIL patterns which are formed by the plurality of opening patterns OP and spaced apart from each other.

As such, in the display device according to some example embodiments of the present invention, the insulating layer CIL includes the plurality of opening patterns OP which is spaced apart from each other in one direction to correspond to the bending area BA of the flexible substrate 100, and as a result, the insulating layer CIL positioned to correspond to the bending area BA has an island shape on the flexible substrate 100. The insulating layer CIL positioned on the flexible substrate 100 bent in one direction has the island shape to minimize stress applied to the insulating layer CIL when the flexible substrate 100 is bent in one direction.

Further, in the display device according to some example embodiments of the present invention, the wavy line WL has a vertically zigzag shape to correspond to the bending area BA, and as a result, even though stress generated when the flexible substrate 100 is bent in one direction is applied to the wavy line WL, stress is distributed along a long path of the wavy line WL itself in the bending area BA to suppress the wavy line WL from being damaged by stress.

Hereinafter, a display device according to some example embodiments of the present invention will be described with reference to FIG. 4. Hereinafter, different parts from the display device according to some example embodiments of the present invention described above will be described.

Figure 4:
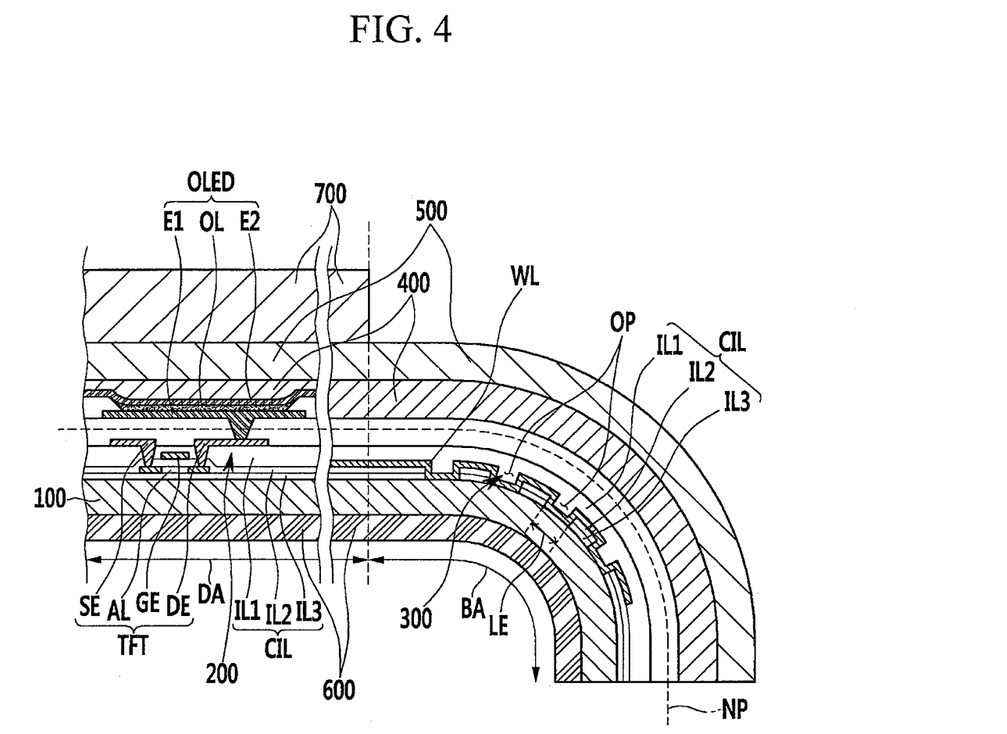
FIG. 4 is a cross-sectional view illustrating a part of a display device, according to an example embodiment of the present invention.

FIG. 4 is a cross-sectional view illustrating a part of a display device according to some example embodiments of the present invention.

As illustrated in FIG. 4, a bending unit 300 of the display device according to some example embodiments of the present invention includes an insulating layer CIL extending from a display unit 200 and a wavy line WL extending from the display unit 200.

The insulating layer CIL of the bending unit 300 includes a plurality of opening patterns OP. The plurality of opening patterns OP is spaced apart from each other in one direction.

The opening patterns OP are formed on the insulating layer CIL, particularly, the second sub insulating layer IL2 and the third sub insulating layer IL3.

The wavy line WL is positioned on the same layer as the gate electrode GE, includes the same material as the gate electrode GE, and may be concurrently (e.g., simultaneously) formed with the gate electrode GE.

The wavy line WL is positioned on the insulating layer CIL to correspond to a bending area BA of a flexible substrate 100, and extends in one direction that is a bending direction of the flexible substrate 100 to pass through the plurality of opening patterns OP. The wavy line WL is curved and extends along the surface of the insulating layer CIL and the bottom of each of the plurality of opening patterns OP. In detail, the wavy line WL has a vertically zigzag shape along island-shaped insulating layer CIL patterns which are formed by the plurality of opening patterns OP and spaced apart from each other.

As such, in the display device according to some example embodiments of the present invention, the insulating layer CIL includes the plurality of opening patterns OP which is spaced apart from each other in one direction to correspond to the bending area BA of the flexible substrate 100, and as a result, the insulating layer CIL positioned to correspond to the bending area BA has an island shape on the flexible substrate 100. The insulating layer CIL positioned on the flexible substrate 100 bent in one direction has the island shape to minimize or reduce stress applied to the insulating layer CIL when the flexible substrate 100 is bent in one direction.

Further, in the display device according to some example embodiments of the present invention, the wavy line WL has a vertically zigzag shape to correspond to the bending area BA, and as a result, even though stress generated when the flexible substrate 100 is bent in one direction is applied to the wavy line WL, stress is distributed along a long path of the wavy line WL itself in the bending area BA to suppress the wavy line WL from being damaged by stress.

Hereinafter, a display device according to some example embodiments of the present invention will be described with reference to FIG. 5. Hereinafter, different parts from the display device according to the example embodiments of the present invention described above will be described, but some repetitive description may be omitted.

Figure 5:
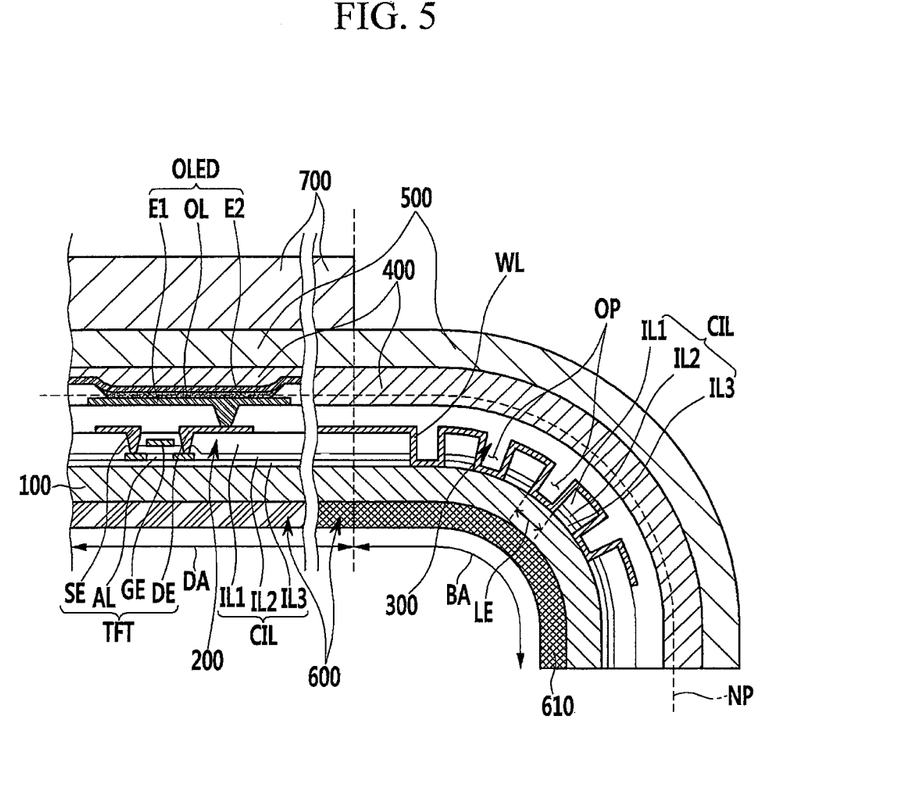
FIG. 5 is a cross-sectional view illustrating a part of a display device, according to an example embodiment of the present invention.

FIG. 5 is a cross-sectional view illustrating a part of a display device according to some example embodiments of the present invention.

As illustrated in FIG. 5, the display device according to some example embodiments of the present invention includes a first protective film 500 positioned on a sealing unit 400 and a second protective film 600 positioned below a flexible substrate 100.

One portion of the flexible substrate 100 corresponding to a bending area BA has a curvature radius in a second protective film 600 direction which is a downward direction.

A Young's modulus of one portion 610 of the second protective film 600 corresponding to the bending area BA is larger than that of the first protective film 500. Meanwhile, a Young's modulus of the entire second protective film 600 may be larger than that of the first protective film 500.

As such, in the display device according to some example embodiments of the present invention, a Young's modulus of one portion 610 of the second protective film 600 positioned in the bending area BA of the flexible substrate 100 having a curvature radius in the second protective film 600 direction is larger than that of the first protective film 500. As a result, when a bending moment is generated in the bending area BA, because one portion 610 of the second protective film 600 is easily transformed by stress, a neutral plane NP of the display device moves to an upper side of the wavy line WL and thus not tensile stress but compressive stress is applied to the insulating layer CIL and the wavy line WL.

As such, in the display device according to some example embodiments of the present invention, one portion 610 of the second protective film 600 corresponding to the bending area BA has a larger Young's modulus than the first protective film 500, and as a result, because the neutral plane NP of the display device formed in the bending area BA bent in one direction is formed above the wavy line WL by moving toward the first protective film 500, not tensile stress but compressive stress is applied to the insulating layer CIL and the wavy line WL to suppress the insulating layer CIL and the wavy line WL from being damaged by tensile stress.

Hereinafter, a display device according to some example embodiments of the present invention will be described with reference to FIG. 6. Hereinafter, different parts from the display device according to the example embodiments of the present invention described above will be described, but some repetitive description may be omitted.

Figure 6:
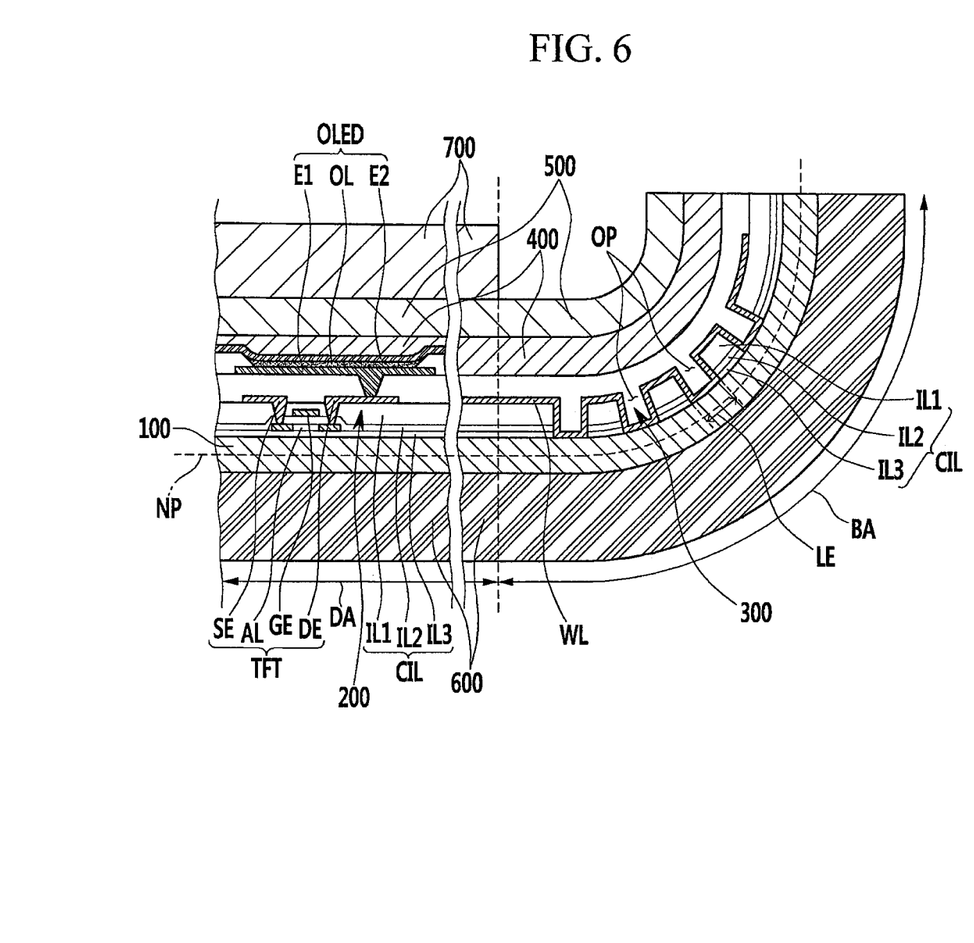
FIG. 6 is a cross-sectional view illustrating a part of a display device, according to an example embodiment of the present invention.

FIG. 6 is a cross-sectional view illustrating a part of a display device according to some example embodiments of the present invention.

As illustrated in FIG. 6, the display device according to some example embodiments of the present invention includes a first protective film 500 positioned on a sealing unit 400 and a second protective film 600 positioned below a flexible substrate 100.

One portion of the flexible substrate 100 corresponding to a bending area BA has a curvature radius in a first protective film 500 direction which is an upward direction.

For example, the second protective film 600 has a larger thickness than the first protective film 500 so that compressive stress is applied to the insulating layer CIL and the wavy line WL corresponding to the bending area BA of the flexible substrate 100.

That is, the second protective film 600 positioned below the wavy line WL corresponding to the bending area BA has a larger thickness than the first protective film 500 positioned above the wavy line WL corresponding to the bending area BA, and as a result, because a neutral plane NP of the display device formed by generating a bending moment in the bending area BA is formed between the wavy line WL and the second protective film 600 which is the lower side of the wavy line WL, not tensile stress but compressive stress is applied to the insulating layer CIL and the wavy line WL.

As such, in the display device according to some example embodiments of the present invention, the second protective film 600 corresponding to the bending area BA having a curvature radius in the first protective film 500 direction has a larger thickness than the first protective film 500. As a result, because the neutral plane NP of the display device formed in the bending area BA bent in one direction is formed below the wavy line WL by moving toward the second protective film 600, not tensile stress but compressive stress is applied to the insulating layer CIL and the wavy line WL to suppress the insulating layer CIL and the wavy line WL from being damaged by tensile stress.

Hereinafter, a display device according to some example embodiments of the present invention will be described with reference to FIG. 7. Hereinafter, different parts from the display device according to the example embodiments of the present invention described above will be described, but some repetitive description may be omitted.

Figure 7:
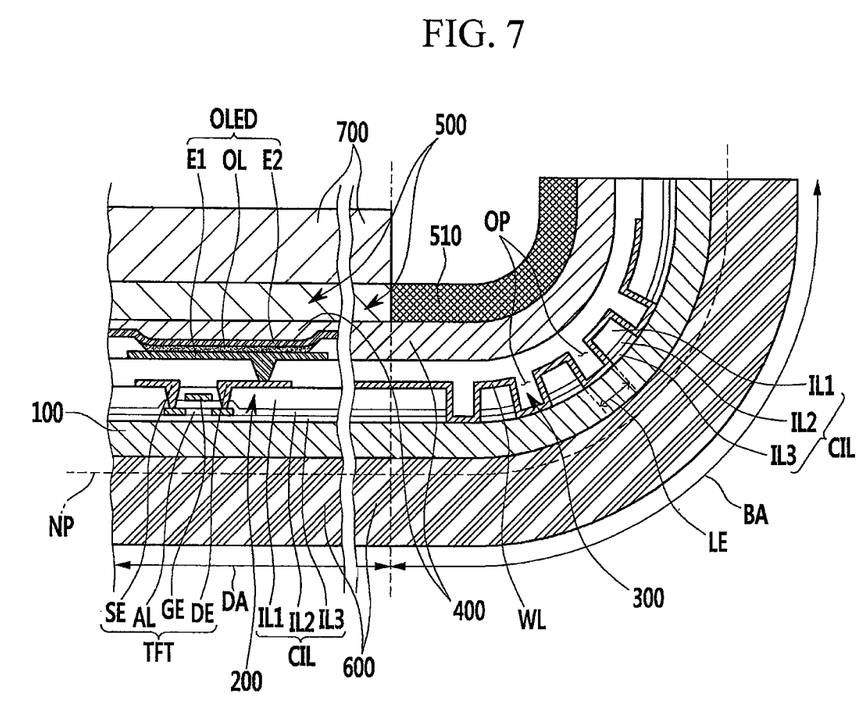
FIG. 7 is a cross-sectional view illustrating a part of a display device, according to an example embodiment of the present invention.

FIG. 7 is a cross-sectional view illustrating a part of a display device according to some example embodiments of the present invention.

As illustrated in FIG. 7, the display device according to some example embodiments of the present invention includes a first protective film 500 positioned on a sealing unit 400 and a second protective film 600 positioned below a flexible substrate 100.

One portion of the flexible substrate 100 corresponding to a bending area BA has a curvature radius in a first protective film 500 direction which is an upward direction.

The second protective film 600 has a larger thickness than the first protective film 500 so that compressive stress is applied to the insulating layer CIL and the wavy line WL corresponding to the bending area BA of the flexible substrate 100.

That is, the second protective film 600 positioned below the wavy line WL corresponding to the bending area BA has a larger thickness than the first protective film 500 positioned above the wavy line WL corresponding to the bending area BA. As a result, because a neutral plane NP of the display device formed by generating a bending moment in the bending area BA is formed between the wavy line WL and the second protective film 600 which is the lower side of the wavy line WL, not tensile stress but compressive stress is applied to the insulating layer CIL and the wavy line WL.

A Young's modulus of the other portion 510 of the first protective film 500 corresponding to the bending area BA is larger than that of the second protective film 600. Meanwhile, a Young's modulus of the entire first protective film 500 may be larger than that of the second protective film 600.

As such, in the display device according to some example embodiments of the present invention, the second protective film 600 corresponding to the bending area BA having a curvature radius in the first protective film 500 direction has a larger thickness than the first protective film 500. As a result, because the neutral plane NP of the display device formed in the bending area BA bent in one direction is formed below the wavy line WL by moving toward the second protective film 600, not tensile stress but compressive stress is applied to the insulating layer CIL and the wavy line WL to suppress the insulating layer CIL and the wavy line WL from being damaged by tensile stress.

Further, in the display device according to some example embodiments of the present invention, a Young's modulus of the other portion 510 of the first protective film 500 positioned in the bending area BA of the flexible substrate 100 having a curvature radius in the first protective film 500 direction is larger than that of the second protective film 600. As a result, when a bending moment is generated in the bending area BA, because the other portion 510 of the first protective film 500 is easily transformed by stress, a neutral plane NP of the display device moves to a lower side of the wavy line WL and thus not tensile stress but compressive stress is applied to the insulating layer CIL and the wavy line WL.

As such, in the display device according to some example embodiments of the present invention, the other portion 510 of the first protective film 500 corresponding to the bending area BA has larger Young's modulus than the second protective film 600. As a result, because the neutral plane NP of the display device formed in the bending area BA bent in one direction is formed below the wavy line WL by moving toward the second protective film 600, not tensile stress but compressive stress is applied to the insulating layer CIL and the wavy line WL to suppress the insulating layer CIL and the wavy line WL from being damaged by tensile stress.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A display device, comprising:
   a flexible substrate comprising a bending area bent in one direction and a display area where images are displayed;
   a display unit above the flexible substrate in the display area, the display unit including an organic light emitting diode (OLED), a transistor coupled to the OLED, and one or more wires coupled to the transistor and the OLED;
   an insulating layer on the flexible substrate and extending across the display area and the bending area, the insulating layer comprising a plurality of opening patterns spaced apart from each other at the bending area;
   a wavy line extending through the plurality of opening patterns;
   a first protective film above the display unit in the display area and the wavy line in the bending area;
   a second protective film below the flexible substrate and overlapping the display unit in the display area and the wavy line in the bending area; and
   a sealing unit disposed on the display unit,
   wherein the bending area is outside the display area,
   wherein the sealing unit covers the OLED of the display area, extends to the bending area, and disposes between the wavy line and the first protective film in the bending area, and
   wherein compressive stress is applied to the wavy line at the bending area.

2. The display device of claim 1, wherein:
   the wavy line is curved and extends along a surface of the insulating layer and a bottom of each of the plurality of opening patterns.

3. The display device of claim 1, wherein the first protective film is thicker than the second protective film and the flexible substrate is bent with a center of radius of curvature closer to the second protective film than the first protective film.

4. The display device of claim 1, wherein the display area is at a center of the flexible substrate, and the bending area is at a peripheral area of the flexible substrate.

5. The display device of claim 1, wherein the display area is adjacent the bending area, and
   the display device further comprises a window on display unit at the display area.

6. The display device of claim 5, wherein:
   the window covers the display area and not the bending area.

7. The display device of claim 1, wherein the organic light emitting element comprises:
   a first electrode connected with a thin film transistor;
   an organic emission layer on the first electrode; and
   a second electrode on the organic emission layer.

8. The display device of claim 7, wherein the thin film transistor comprises:
   an active layer on the flexible substrate;
   a gate electrode on the active layer; and
   a source electrode and a drain electrode connected with the active layer.

9. The display device of claim 8, wherein the wavy line is on a same layer as at least one of the gate electrode and the source electrode.

10. The display device of claim 8, wherein the insulating layer further comprises a first sub insulating layer covering the gate electrode.

11. The display device of claim 10, wherein the opening patterns are on the first sub insulating layer.

12. The display device of claim 10, wherein the insulating layer further comprises a second sub insulating layer covering the active layer.

13. The display device of claim 12, wherein the opening patterns are on at least one of the first sub insulating layer and the second sub insulating layer.

14. The display device of claim 12, wherein the insulating layer further comprises a third sub insulating layer between the flexible substrate and the active layer.

15. The display device of claim 14, wherein the opening patterns are on at least one of the first sub insulating layer, the second sub insulating layer, and the third sub insulating layer.

16. The display device of claim 1, wherein
   the second protective film is thicker than the first protective film and the flexible substrate is bent with a center of radius of curvature closer to the first protective film than the second protective film.

17. The display device of claim 1, wherein a Young's modulus of the second protective film is larger than a Young's modulus of the first protective film.

18. The display device of claim 1, wherein a Young's modulus of the first protective film is larger than a Young's modulus of the second protective film.

19. The display device of claim 16, wherein the flexible substrate has a curvature radius at the bending area, and
   a distance between adjacent opening patterns among the plurality of opening patterns is proportional to a size of the curvature radius.

20. The display device of claim 3, wherein the flexible substrate has a curvature radius at the bending area, and
   a distance between adjacent opening patterns among the plurality of opening patterns is proportional to a size of the curvature radius.

21. The display device of claim 16, wherein the insulating layer comprises an inorganic material or an organic material.

22. The display device of claim 3, wherein the insulating layer comprises an inorganic material or an organic material.

* * * * *